(12) United States Patent
Itai et al.

(10) Patent No.: US 8,373,147 B2
(45) Date of Patent: Feb. 12, 2013

(54) EXPOSURE APPARATUS AND DEVICE MANUFACTURING METHOD

(75) Inventors: Daisuke Itai, Yokohama (JP); Kunitaka Ozawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 641 days.

(21) Appl. No.: 12/566,293

(22) Filed: Sep. 24, 2009

(65) Prior Publication Data

US 2010/0081096 A1   Apr. 1, 2010

(30) Foreign Application Priority Data

Sep. 26, 2008   (JP) ................................ 2008-248067

(51) Int. Cl.
  *G01N 21/84* (2006.01)
  *G06F 17/00* (2006.01)
(52) U.S. Cl. ......... 250/559.04; 250/559.29; 250/559.41; 355/53; 700/110; 700/121; 702/150; 702/166
(58) Field of Classification Search .................. 250/548, 250/559.04, 559.06, 559.29, 559.3, 559.38, 250/559.4, 559.41; 355/30, 53, 67, 77; 356/237.2, 356/399–401; 700/110, 121; 702/150, 166
See application file for complete search history.

(56) References Cited

U.S. PATENT DOCUMENTS

| | | | | |
|---|---|---|---|---|
| 4,795,911 A | * | 1/1989 | Kohno et al. | 250/559.18 |
| 5,227,862 A | * | 7/1993 | Oshida et al. | 356/490 |
| 7,262,425 B2 | * | 8/2007 | Nishiyama et al. | 250/559.4 |
| 7,426,016 B2 | | 9/2008 | Takada et al. | |
| 8,060,472 B2 | * | 11/2011 | Itai et al. | 707/638 |
| 8,065,270 B2 | * | 11/2011 | Itai et al. | 707/638 |
| 2004/0179190 A1 | * | 9/2004 | Miyashita et al. | 356/124 |
| 2007/0257214 A1 | * | 11/2007 | Nishiyama et al. | 250/559.41 |
| 2010/0081096 A1 | * | 4/2010 | Itai et al. | 430/325 |

FOREIGN PATENT DOCUMENTS

| | | |
|---|---|---|
| JP | 2006-300676 A | 11/2006 |
| JP | 2008-140814 A | 6/2008 |

\* cited by examiner

*Primary Examiner* — John Lee

(74) *Attorney, Agent, or Firm* — Canon USA, Inc., IP Division

(57) ABSTRACT

An information processing apparatus, for processing information of a plurality of measured heights respectively corresponding to a plurality of measurement points on a surface of a substrate held by a chuck, includes a processor and an output device. The processor is configured to specify, with respect to the surface, a plurality of areas that are arrayed and a plurality of sections each constituted by a number of the plurality of areas, extract at least two inclinations of a plurality of inclinations respectively corresponding to the number of the plurality of areas based on the plurality of measured heights with respect to each of the plurality of sections, and cause the output device to output information specifying a section of the plurality of sections that satisfies a first condition that a product of two inclinations among the at least two inclinations exceeds a predetermined threshold.

8 Claims, 7 Drawing Sheets

EXPOSURE APPARATUS AND DEVICE MANUFACTURING METHOD

BACKGROUND OF THE INVENTION

1. Field of the Invention

The present invention relates to information processing for processing information of a plurality of measured heights respectively corresponding to a plurality of measurement points on a surface of a substrate held by a chuck.

2. Description of the Related Art

Recently, circuit patterns on semiconductor devices have been increasingly miniaturized, and the resolution of exposure apparatuses that transfer the patterns onto wafers (also referred to as substrates) has been improved using higher numerical apertures (NAs). However, higher resolution leads to a smaller depth of focus, and requires more correct focusing. Therefore, local defocuses caused by foreign substances adhered to the bottom surfaces of the wafers or wafer chucks that hold the wafers in the exposure apparatuses may become a problem. It is common knowledge that, in such exposure apparatuses, the surface shape (height distribution) of a wafer in a shot area is measured by obliquely projecting light onto the top surface of the wafer so as to form a light pattern thereon and by obliquely illuminating a photo detector with the light reflected from the top surface so as to re-form the light pattern thereon. Japanese Patent Laid-Open No. 2006-300676 describes a method for detecting foreign substances by calculating a surface (approximate surface) that approximates a surface in a shot area from the height distribution thereof and determining separations of the measurement results (heights) from the approximate surface.

The top surface of the wafer needs to be entirely scrutinized so that foreign substances causing the local defocuses are found, and needs to be measured at a large number of measurement points. As the foreign substances to be detected become smaller, the number of measurement points is increased. In addition, the size of areas for determining an approximate surface as described in Japanese Patent Laid-Open No. 2008-140814 needs to be further reduced, resulting in a reduction in processing speed.

It is preferable that the foreign-substance detection be performed immediately after the exposure and that necessary measures be taken. If the removal of the foreign substances, in particular, from the wafer chuck is delayed, the foreign substances may correspondingly cause focus failures. For this reason, a method for swiftly and accurately inspecting a foreign particle has been required.

SUMMARY OF THE INVENTION

According to an aspect of the present invention, an information processing apparatus, for processing information of a plurality of measured heights respectively corresponding to a plurality of measurement points on a surface of a substrate held by a chuck, includes a processor and an output device. The processor is configured to specify, with respect to the surface, a plurality of areas that are arrayed and a plurality of sections each constituted by a number of the plurality of areas, extract at least two inclinations of a plurality of inclinations respectively corresponding to the number of the plurality of areas based on the plurality of measured heights with respect to each of the plurality of sections, and cause the output device to output information specifying a section of the plurality of sections that satisfies a first condition that a product of two inclinations among the at least two inclinations exceeds a predetermined threshold.

According to the present invention, for example, foreign substances can be swiftly and accurately inspected.

Other objects and advantages besides those discussed above shall be apparent to those skilled in the art from the description of a preferred embodiment of the invention which follows. In the description, reference is made to accompanying drawings, which form apart thereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Exemplary embodiments of the present invention will now be described with reference to the drawings.

First Exemplary Embodiment

Figure 1:
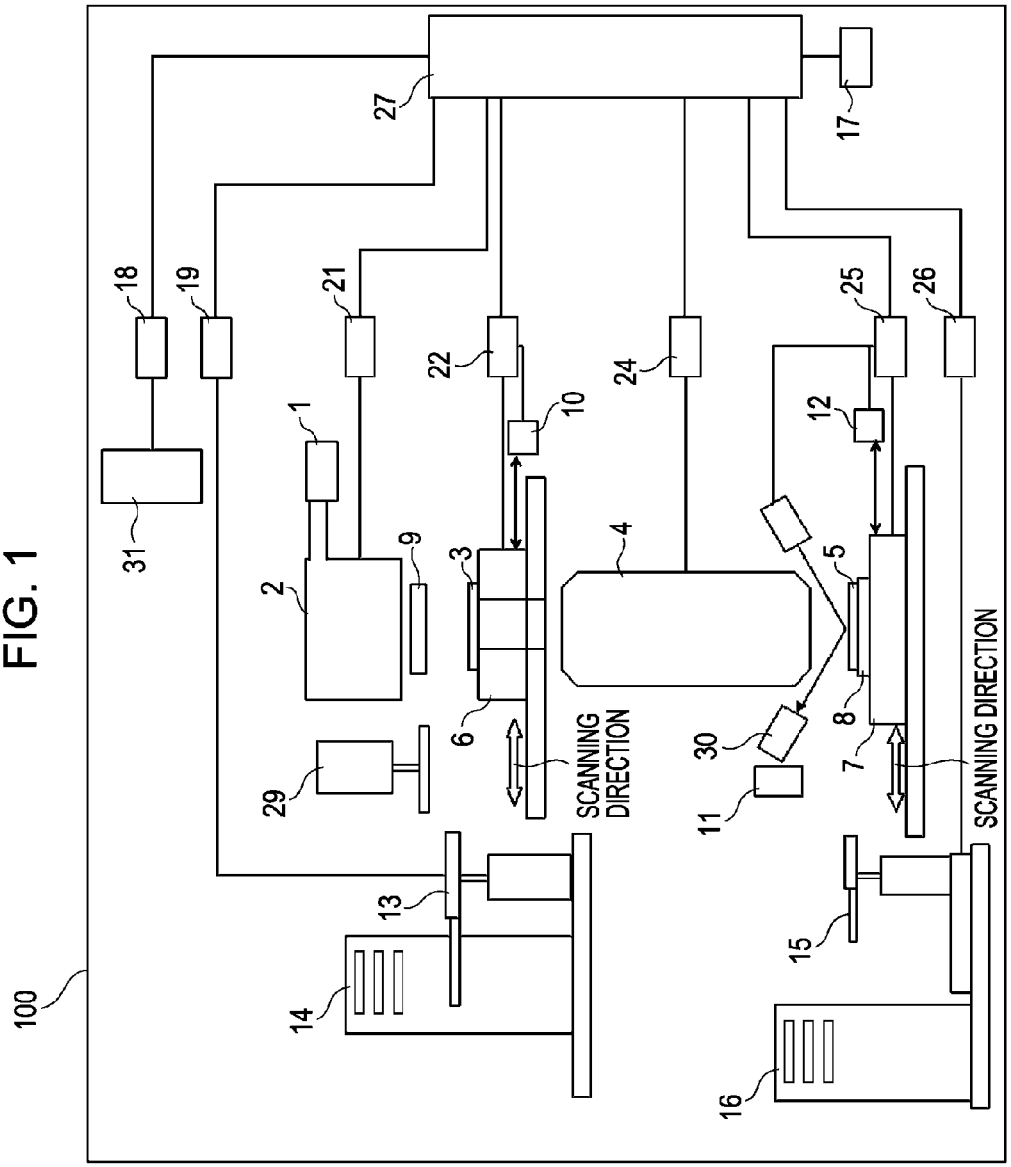
FIG. 1 illustrates an example structure of an exposure apparatus according to a first exemplary embodiment of the present invention.

FIG. 1 illustrates an example structure of an exposure apparatus according to a first exemplary embodiment of the present invention. An exposure apparatus 100 according to this exemplary embodiment is of the scanning type. In the exposure apparatus 100, the shape and the light intensity distribution of a light beam provided by a light source 1 are adjusted by an illumination optical system 2, and the light beam illuminates a reticle (original) 3 held by a reticle stage 6. The pattern of the reticle 3 is transferred to a wafer (substrate) 5, on which a photoresist is applied, held by a wafer-holding chuck (also referred to as a wafer chuck) 8 disposed on a wafer stage 7 via a projection optical system 4. With this, a latent pattern is formed on the photoresist. The latent pattern is developed during a development step so as to be a mask pattern (resist pattern).

The illumination optical system 2 can include, for example, a plurality of aperture stops with various circular opening areas used for setting a coherence factor σ. The illumination optical system 2 can further include a ring-shaped diaphragm for annular illumination, a quadrupole diaphragm, and a mechanism for adjusting the amount of illumination light (for example, a plurality of neutral-density (ND) filters and a mechanism for switching the filters). The illumination optical system 2 can further include a detector for measuring the amount of light, a slit defining the shape of the light beam, a blade for limiting the illumination range disposed so as to be conjugate to the reticle 3, and a mechanism for driving the blade. The operation of the light source 1 and the illumination optical system 2 is controlled in accordance with instructions issued by a light-source control unit 21.

The projection optical system 4 can include a mechanism for setting the numerical aperture and a lens-driving mechanism for correcting aberration. The operation of the projection optical system 4 is controlled by a projection-optical-system control unit 24.

The position (positions in directions of axes (X-axis and Y-axis) orthogonal to each other in a plane orthogonal to the optical axis (Z-axis) of the projection optical system 4) and the rotational angle around the Z-axis of the reticle stage 6 are measured by a reticle-stage measurement device 10, and are controlled by a reticle-stage control unit 22.

A through-the-reticle (TTR) measurement optical system 9 is disposed between the illumination optical system 2 and the reticle stage 6. The TTR measurement optical system 9 measures the relative positions of marks on the reticle 3 or reference marks on the reticle stage 6 and those on the wafer stage 7 via the projection optical system 4. With this, the positions in the direction of the optical axis of the projection optical system 4 (Z-direction), the positions in the directions of the two axes orthogonal to each other in a place orthogonal to the optical axis (X-direction and Y-direction), and the rotational angles around these axes of the reticle stage 6, the reticle 3, and the wafer stage 7 are measured.

A wafer-stage measurement device 12 measures, for example, the position in the direction of the optical axis of the projection optical system 4 (Z-direction), the positions in the directions of the two axes orthogonal to each other in a place orthogonal to the optical axis (X-direction and Y-direction), and the rotational angles around these axes of the wafer stage 7. A focus measurement device 30 can measure the surface position of the wafer 5 in the direction of the optical axis of the projection optical system 4 (Z-direction). A wafer-stage control unit 25 controls the position of the wafer stage 7 on the basis of information provided by the wafer-stage measurement device 12 and the focus measurement device 30.

An off-axis measurement optical system 11 measures the surface of the wafer 5 using non-exposure light. A plurality of marks on the wafer 5 are measured by the off-axis measurement optical system 11, and the positions and the shapes of the patterns (shot regions) on the wafer are calculated so that the pattern of the reticle 3 is transferred to the wafer 5 in accordance with the shot regions on the wafer 5. In addition, the off-axis measurement optical system 11 measures the positions of the reference marks on the wafer stage 7.

The reticle 3 held by the reticle stage 6 is driven in a scanning direction shown in FIG. 1 so that all the pattern range of the reticle 3 is transferred to the wafer 5 by scanning exposure using an oblong illumination beam. At the same time, the wafer 5 held by the wafer stage 7 is also driven in the scanning direction shown in FIG. 1. Herein, the reticle 3 and the wafer 5 are driven at a speed ratio in accordance with the projection magnification of the projection optical system 4. When the relative positions of the reticle 3 and the wafer 5 are shifted, deformed patterns are transferred to the wafer 5. To avoid this, a main control unit 27 calculates the shift in the relative positions of the reticle 3 and the wafer 5, and controls the reticle-stage control unit 22 and the wafer-stage control unit 25 such that the shift in the relative positions becomes zero.

The exposure apparatus 100 further includes a reticle-conveyance unit constituted by, for example, a reticle library 14 and a reticle robot 13 and a reticle-alignment unit 29 for positioning the reticle 3 to the marks on the reticle stage 6. The reticle-conveyance unit operates in accordance with instructions issued by a reticle-conveyance control unit 19. The exposure apparatus 100 further includes a wafer-conveyance unit constituted by, for example, a wafer-cassette elevator 16 and a wafer-carrying robot 15. The wafer-conveyance unit operates in accordance with instructions issued by a wafer-conveyance control unit 26.

A chamber 31 mainly adjusts the air temperature and cleans air by filtering minute foreign substances such that the internal environmental temperature in the exposure apparatus 100 is maintained constant. The chamber 31 operates in accordance with instructions issued by a chamber control unit 18.

The main control unit 27 controls the components of the exposure apparatus 100, for example, the chamber control unit 18, the reticle-conveyance control unit 19, the wafer-conveyance control unit 26, the reticle-stage control unit 22, the wafer-stage control unit 25, the light-source control unit 21, and the projection-optical-system control unit 24. The main control unit 27 can acquire setting parameters that define exposure operation of the exposure apparatus 100 or operating instructions of the exposure apparatus 100 via a communication interface 17, and control the components of the exposure apparatus 100 on the basis of the parameters or the instructions. The main control unit 27 has a function of transmitting information to an external storage 300 (described below) via the communication interface 17. The information to be transmitted can include, for example, the above-described setting parameters, the contents of the operating instructions, operating states, operation results, measurement results, error events, apparatus identification data, lot identification data, job names, wafer numbers, shot numbers, and time of occurrence.

In this exemplary embodiment, the focus measurement device 30 for measuring the top surface of the wafer can be used for detecting whether foreign substances adhere onto the wafer or the wafer chuck. For example, the focus measurement device can be of the known oblique incident radiation type, and include a projector that obliquely projects a light beam onto the top surface of the wafer and an optical receiver that photoelectrically detects the refocused reflected light beam (see Japanese Patent Laid-Open No. 4-354320). Measurement of the heights (z coordinates) of a plurality of measurement points in partial areas on the surface to be tested using a plurality of light beams can provide the inclinations (wx, xy) of the areas in addition to the heights (Z) of the areas.

A method for detecting foreign substances in each section on the wafer according to the first exemplary embodiment of the present invention will now be described. The arrangement of the sections on the wafer can be determined by, for example, the size, the arrangement direction, and the array pitch of the sections. For example, a shot region on the wafer 5 to which the pattern of the reticle 3 is transferred by scanning exposure can be defined as a section, or a shot region defined in an exposure job can be defined as a section.

Figure 4:
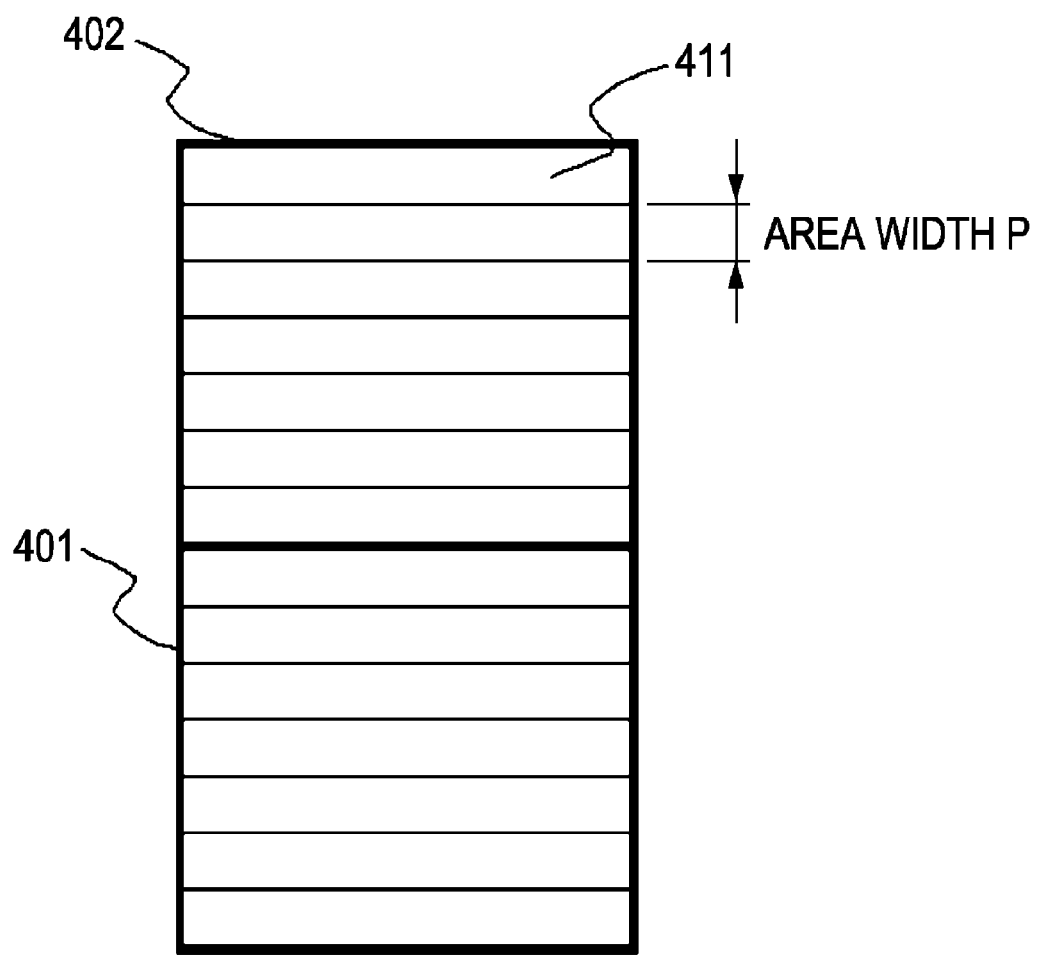
FIG. 4 illustrates areas and sections constituted by the areas.

In order to detect foreign substances in the sections, for example, the sections are partitioned into a plurality of areas, and areas are used for defining the sections. In the first exemplary embodiment, a shot region is defined as a section, and the sections are evenly partitioned into a plurality of areas. In FIG. 4, sections 401 and 402 are evenly partitioned in the Y-direction serving as the scanning direction into a plurality of areas 411 with a width P. In this manner, although not limited thereto in a concrete manner, the areas and the sections each constituted by a number of the areas are specified (defined) on the surface of the wafer. The inclination of each of the areas for detecting foreign substances is defined by, for example, the rotational angle wx around the X-axis serving as the inclination of the Y-axis. The inclinations of the areas can be determined by the results measured by the focus measurement device 30 while the surface of the wafer 5 held by the wafer-holding chuck 8 on the wafer stage 7 is driven in the scanning direction.

The main control unit 27 of the exposure apparatus 100 transmits the wx values of the areas and the position information on the areas to the external storage 300 via the communication interface 17. Although not used in the first exemplary embodiment, the Z values and the wy values of the areas and the heights (z values) of the measurement points measured by the focus measurement device 30 and the position information on the measurement points can be transmitted. The main control unit 27 can add information such as the wafer numbers and the time of occurrence to the information to be transmitted. When the exposure apparatus defines the sections in units of lots using the information on the shot regions and the arrangement thereof defined in the exposure job, the lot identification data, the job names, and the shot numbers can also be added to the information.

Figure 2:
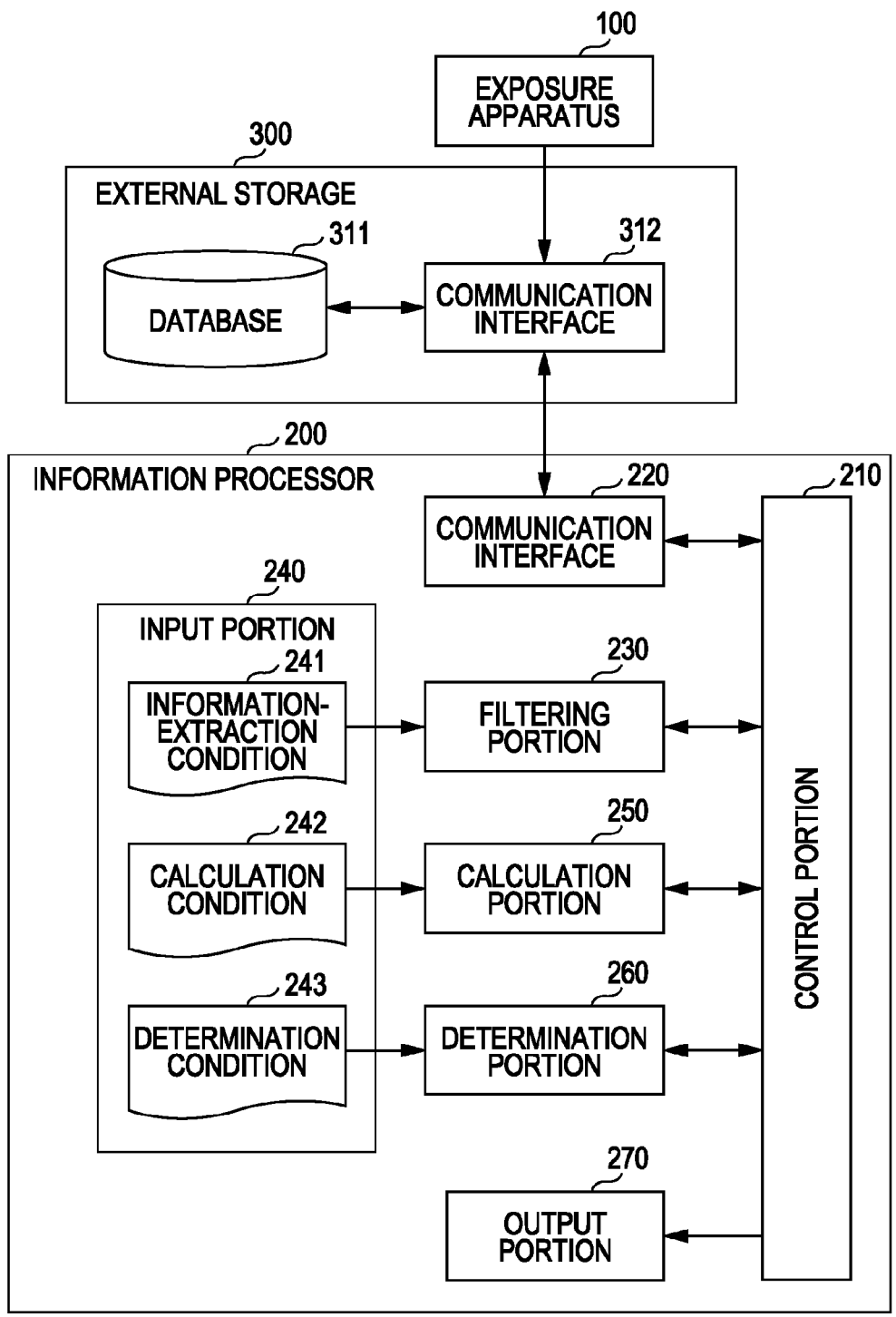
FIG. 2 illustrates an example system configuration according to the first exemplary embodiment of the present invention.

FIG. 2 illustrates an example configuration of a processing system according to the first exemplary embodiment of the present invention. The processing system includes the exposure apparatus 100, the external storage 300, and an information processor 200 connected to each other via communication interfaces.

The external storage 300 collects the above-described information from the exposure apparatus 100 via a communication interface 312, and stores the information in a database 311.

The information processor 200 can process the information provided by the exposure apparatus 100. The information processor 200 can be configured by, for example, installing computer programs in a general-purpose computer. The general-purpose computer includes a processing unit (also referred to as a processor, and including a control unit, a main storage unit, and an arithmetic unit), an input device (for example, a keyboard and a mouse), and an output device (for example, a display and a printer). The information processor 200 operates as an apparatus including a control portion 210, a communication interface 220, a filtering portion 230, an input portion 240, a calculation portion 250, a determination portion 260, and an output portion 270 by installing the computer programs in the general-purpose computer. Alternatively, the information processor 200 operates as an apparatus executing communication processing, control processing, filter processing, input processing, calculation processing, determination processing, and output processing by installing the computer programs in the general-purpose computer.

Figure 3:
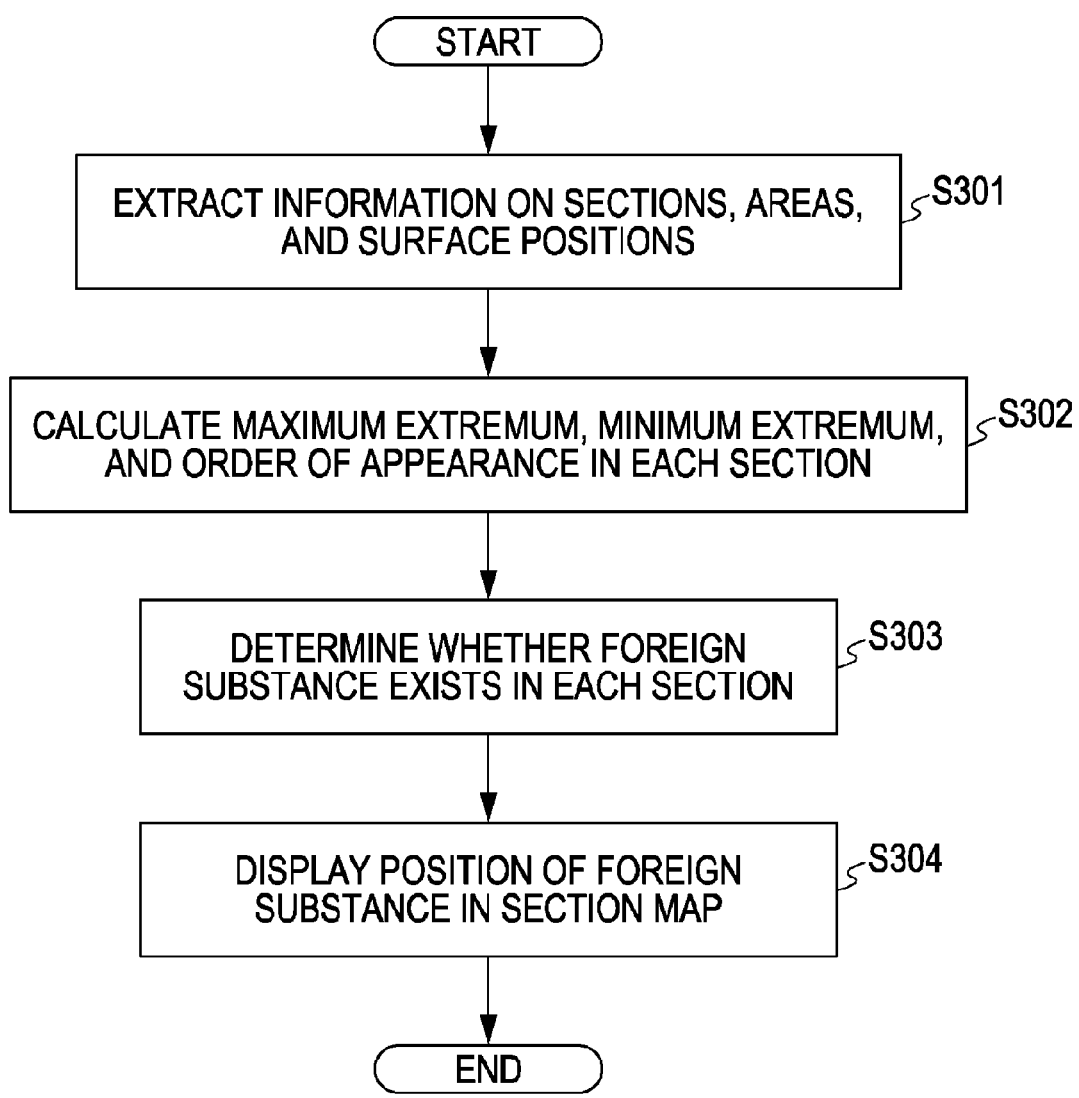
FIG. 3 is a flow chart illustrating an example information processing according to the first exemplary embodiment of the present invention.

FIG. 3 is a flow chart illustrating an example information processing executed by the processing system.

A filtering step S301 extracts the wx values of the areas and the position information on the areas, the wafer number, and the time of occurrence stored in the external storage 300 using the filtering portion 230. When the exposure apparatus defines (specifies) the sections in units of lots using the information on the shot regions and arrangement thereof defined in the exposure job, the lot identification data, the job names, the shot numbers, and the position information on the sections, for example, can be specified as extraction conditions through the input portion 240.

A calculation step S302 processes the measured values of the areas included in the sections using the calculation portion 250 under calculation conditions specified through the input portion 240. The ranges and the positions of the sections can be defined (specified) by the calculation conditions input from the input portion 240 of the information processor 200 instead of being defined by the exposure apparatus.

Figure 5:
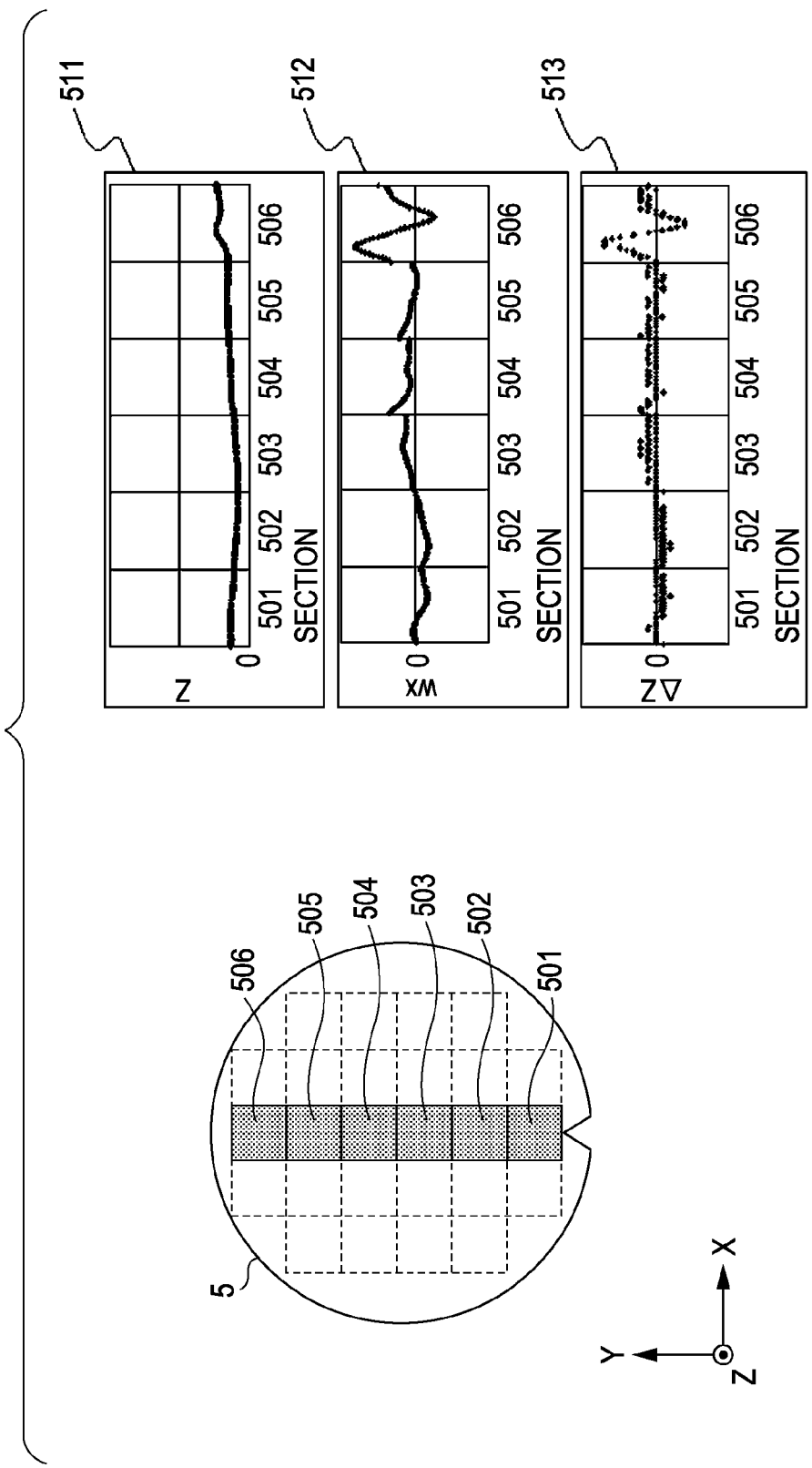
FIG. 5 illustrates graphs obtained from values each measured at a corresponding area in sections disposed in series.

FIG. 5 includes graphs 511 and 512 illustrating the heights Z and the inclinations wx, respectively, measured at the areas in sections 501 to 506 disposed in series in the Y-direction at the same X position (column) on the wafer 5. Since a foreign substance existed in the section 506, the graph illustrating the Z values projected upward in the section 506. The graph illustrating the wx values rose upward and fell downward in this order along the Y-direction in the section 506. At the position of the foreign substance, the inclination wx became positive at first, and became negative as the measurement point became separated from the top of the foreign substance, that is, the extremum of the rise was positive, and that of the fall was negative. Therefore, the product of these two extrema became a large negative value. Thus, calculation of the product of the maximum and minimum extrema of the wx values in the areas disposed in series in each of the sections and detection of the order of appearance of the maximum and minimum extrema, for example, are specified as calculation conditions. The calculation portion performs processing in accordance with the instructions.

The areas used for calculation of a section are not limited to those in the section, and it can be specified in the calculation conditions that the areas in the adjacent sections are also used. For example, when a foreign substance exists on the border of two sections, the extrema may not be detected. The range of the areas to be used can be determined on the basis of the size of foreign substances to be detected.

A determination step S303 determines whether the product calculated by the calculation portion exceeds a predetermined threshold (whether a foreign particle exists) by comparing the product with the predetermined threshold using the determination portion. A value suitable for determination of existence of foreign substances can be set as the threshold on the basis of, for example, the depth of focus of the projection optical system of the exposure apparatus and the focusing accuracy permissible to the pattern to be transferred to the wafer. In this exemplary embodiment, when a first condition that the product is smaller than a predetermined negative threshold and a second condition that the maximum extremum and the minimum extremum appear in this order are satisfied, it is determined that a foreign substance exists in the section. Although it is desirable that the threshold be negative, the present invention is not limited to this, and the threshold can be zero or positive as appropriate.

Figure 6:
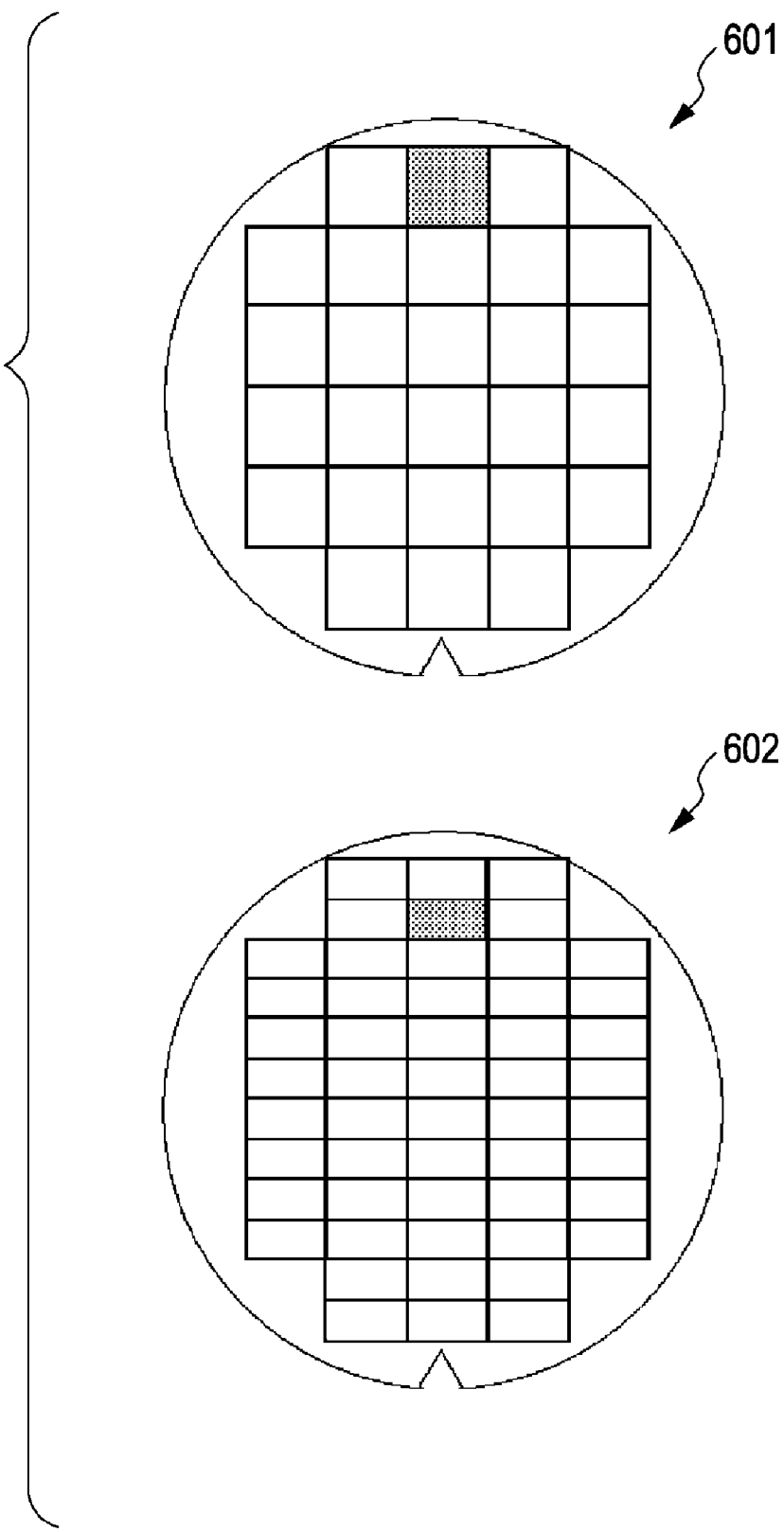
FIG. 6 illustrates maps that show results of foreign-substance determination.

An output step S304 outputs the results obtained at the determination portion using the output portion. For example, as shown in FIG. 6, when it is determined that a foreign substance exists in a section in a map 601 illustrating all the sections arranged on the wafer, the section in which a foreign substance exists is illustrated in a manner different from that in which the other sections are illustrated (for example, by a different color). Moreover, degrees (levels) of possibility of existence of foreign substances can be determined in the determination step by, for example, setting a plurality of thresholds, and the sections can be illustrated in the map 601 in a manner in accordance with the levels (for example, with colors or a gray scale). In this manner, the sections for which there is a possibility of existence of foreign substances or the degrees of the possibility can be easily recognized from the map 601. Furthermore, when the information on the sections includes, for example, the lot identification data, the job names, the wafer numbers, and the shot numbers, the information can also be output (illustrated) with the sections. In addition, the sections can be obtained by partitioning each shot region. In this case, the information on the shot numbers can also be output in the sections in which it is determined that foreign substances exist. A map 602 shown in FIG. 6 is an example display of results of foreign-substance determination by vertically (in the Y-axis direction) partitioning each shot region into two sections.

In the description above, the plurality of areas are obtained by partitioning the sections in the Y-direction. However, the direction of partitioning is not limited to the Y-direction, and the sections can be partitioned in the X-direction. In this case, the wy values are used as the inclinations.

Although the product of the maximum and minimum extrema and the order of appearance thereof are used as the determination conditions, only the product of the maximum and minimum extrema can be used. Moreover, the order of appearance of the maximum and minimum values in each section and the product thereof can be used as the determination conditions, and only the product of the maximum and minimum values in each section can be used as the determination conditions. Furthermore, the following processing can be performed instead of calculating the maximum and minimum extrema or the maximum and minimum values. That is, first, at least two inclinations among those of the areas in each section are extracted. These at least two inclinations can refer to all the inclinations in each section or a number of the inclinations that are thinned out as appropriate. Subsequently, it is determined that foreign substances exist in the sections which satisfy a condition that the products of the two inclinations among the at least two inclinations exceed a predetermined threshold.

The structure according to this exemplary embodiment can simplify the calculation, and thus improve the processing speed.

Second Exemplary Embodiment

Instead of using the wx values of the areas as in the first exemplary embodiment, differences between the Z values ($\Delta Z$) of the areas and those of the adjacent (immediately preceding) areas can be used. In this case, the Z value of each of the areas is extracted by the filtering portion, and the difference between the Z value of the area and that of the adjacent area is calculated by the calculation portion. When no adjacent areas exist in the same sections, areas not only in the sections but in the adjacent sections can be used.

For example, the differences between the Z values of the areas and those of the immediately preceding areas in the Y-direction are defined as $\Delta Z$. The $\Delta Z$ values in the sections 501 to 506 shown in FIG. 5 are illustrated in a graph 513. In the section 506 where a foreign substance exists, the graph shows a rise and a fall as does the graph 512. Therefore, existence of foreign substances in the sections can be determined using the $\Delta Z$ values as in the first exemplary embodiment using the wx values.

Third Exemplary Embodiment

Figure 7:
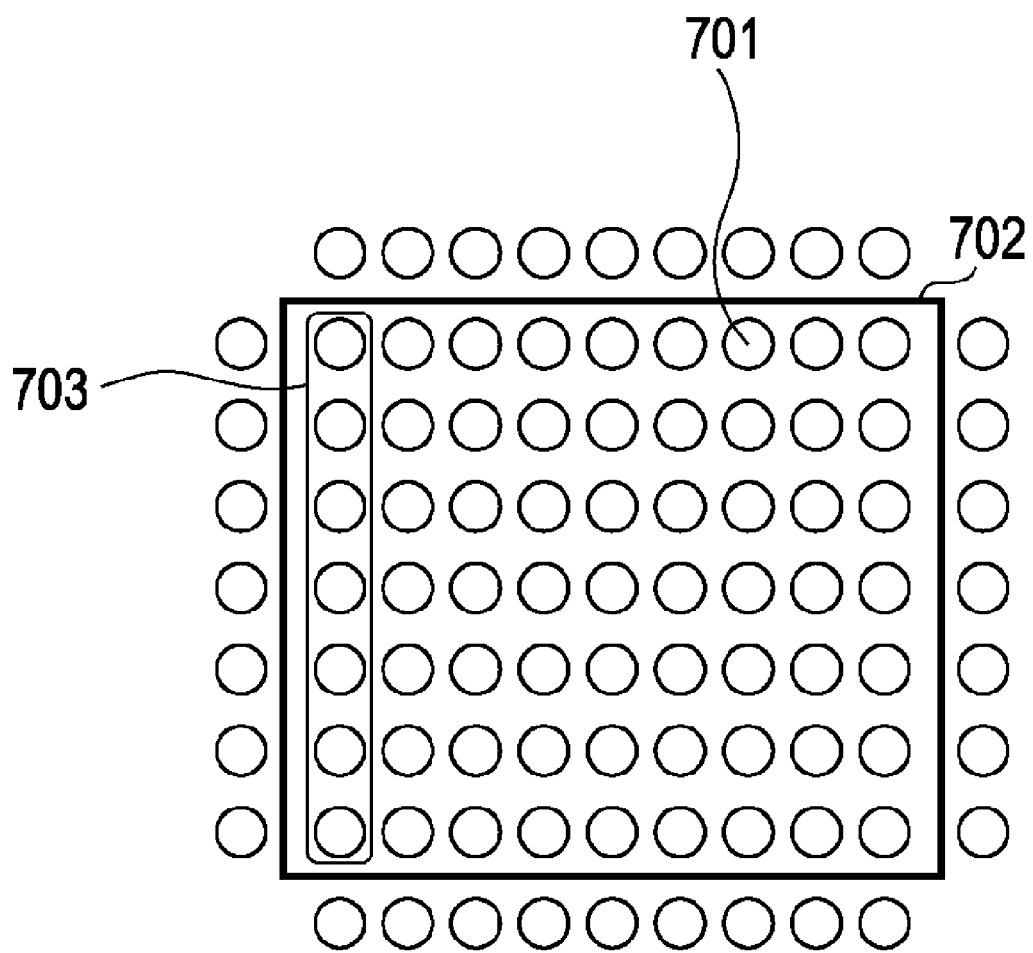
FIG. 7 illustrates the arrangement of measurement points in and in the vicinity of a section.

Instead of using the Z values of the areas as in the second exemplary embodiment, the z values measured at the measurement points by the focus measurement device 30 can be used. FIG. 7 illustrates the arrangement of measurement points 701. For example, differences between the z values of the measurement points at the same X positions (columns) in a section 702 and those of the measurement points immediately preceding in the Y-direction are defined as $\Delta z$. Foreign substances can be detected by determining the maximum and minimum extrema and the order of appearance thereof in each column 703 in the section as in the first exemplary embodiment. The same processing can also be performed on the measurement points at the same Y positions (rows) in the section. When no adjacent measurement points exist in the section as in the second exemplary embodiment, measurement points not only in the section but in the adjacent sections can be used.

Fourth Exemplary Embodiment

The focus measurement described in the first to third exemplary embodiments can be performed in parallel with the scanning exposure. Alternatively, the focus measurement can be performed in parallel with scanning of the wafer stage. In the latter case, the exposure apparatus 100 can include a measurement station including the focus measurement device 30 at a position remote from the exposure station including the projection optical system 4 and a plurality of wafer stages 7 such that the exposure and the focus measurement are performed at the same time.

Instead of using the measurement results obtained by the focus measurement device 30 in the exposure apparatus 100 as described above, a measurement apparatus disposed outside the exposure apparatus and measuring the surface shape (height distribution) of the wafer held by the wafer chuck can be used. Moreover, the exposure apparatus 100, the above-described measurement apparatus, or an inspection apparatus for inspecting devices (including unfinished devices) can include the information processor 200 and the external storage 300 or these functions.

Device Manufacturing Method

Next, a method of manufacturing a device (semiconductor device, liquid crystal display device, etc.) as an embodiment of the present invention is described.

The semiconductor device is manufactured through a front-end process in which an integrated circuit is formed on a wafer, and a back-end process in which an integrated circuit chip is completed as a product from the integrated circuit on the wafer formed in the front-end process. The front-end process includes a step of exposing a wafer with a photoresist coated thereon to light using the above-described exposure apparatus of the present invention, and a step of developing the exposed wafer. The back-end process includes an assembly step (dicing and bonding), and a packaging step (sealing).

The liquid crystal display device is manufactured through a process in which a transparent electrode is formed. The process of forming a transparent electrode includes a step of coating a photoresist on a glass substrate with a transparent conductive film deposited thereon, a step of exposing the glass substrate with the photoresist coated thereon to radiant energy (light, x-ray, charged-particle beam, etc.) using the above-described exposure apparatus, and a step of developing the exposed glass substrate.

The device manufacturing method of this embodiment has an advantage, as compared with a conventional device manufacturing method, in at least one of performance, quality, productivity and production cost of a device.

While desirable embodiments of the present invention have been described above, it is to be understood that the invention is not limited to the disclosed exemplary embodiments. Any modification or variation within the scope of the invention should be possible.

This application claims the benefit of Japanese Patent Application No. 2008-248067 filed Sep. 26, 2008, which is hereby incorporated by reference herein in its entirety.

What is claimed is:

1. A method of processing information of a plurality of measured heights respectively corresponding to a plurality of measurement points on a surface of a substrate held by a chuck by operating a computer, the method comprising steps of:
    specifying, with respect to the surface, a plurality of areas that are arrayed and a plurality of sections each constituted by a number of the plurality of areas;
    extracting, with respect to each of the plurality of sections, at least two inclinations from a plurality of inclinations which are respectively obtained with respect to the number of the plurality of areas based on the plurality of measured heights; and
    causing an output device to output information specifying a section of the plurality of sections that satisfies a first condition that a product of two inclinations among the at least two inclinations exceeds a predetermined threshold.

2. A computer-readable non-transitory storage medium storing a program that causes a computer to execute steps of a method defined in claim 1.

3. A method according to claim 1, wherein the at least two inclinations are a maximum extremum and a minimum extremum among the plurality of inclinations, the threshold is negative, and the first condition is that the product is smaller than the threshold.

4. A method according to claim 3, wherein the causing step causes the output device to output information specifying a section of the plurality of sections that satisfies the first condition and a second condition that the maximum extremum and the minimum extremum appear in this order.

5. A method according to claim 3, wherein the maximum extremum is replaced with a maximum value, and the minimum extremum is replaced with a minimum value.

6. A method according to claim 1, further comprising a step of calculating a difference between two measured heights respectively corresponding to one of the plurality of areas and another of the plurality of areas immediately preceding the one with respect to each of the plurality of areas, and the extracting step uses, as each of the plurality of inclinations, the difference corresponding thereto.

7. A method according to claim 1, wherein the plurality of sections respectively correspond to a plurality of shot regions, each of which is exposed to radiant energy by an exposure apparatus with the substrate held by the chuck.

8. A method according to claim 1, wherein the causing step causes the output device to further output information corresponding to the substrate.

* * * * *